(12) United States Patent  
Zhou et al.

(10) Patent No.: US 12,224,254 B2  
(45) Date of Patent: Feb. 11, 2025

(54) MILLIMETER-WAVE ANTENNA CHIP AND TERMINAL DEVICE

(71) Applicant: HUAWEI TECHNOLOGIES CO., LTD., Guangdong (CN)

(72) Inventors: Weixi Zhou, Shanghai (CN); Liangsheng Liu, Shenzhen (CN); Guowen Liu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 363 days.

(21) Appl. No.: 17/855,358

(22) Filed: Jun. 30, 2022

(65) Prior Publication Data

US 2022/0336387 A1  Oct. 20, 2022

Related U.S. Application Data

(63) Continuation of application No. PCT/CN2019/130810, filed on Dec. 31, 2019.

(51) Int. Cl.
| | |
|---|---|
| *H01L 23/66* | (2006.01) |
| *H01Q 1/22* | (2006.01) |
| *H01Q 1/24* | (2006.01) |
| *H01Q 1/42* | (2006.01) |
| *H01Q 21/06* | (2006.01) |

(52) U.S. Cl.
CPC .......... *H01L 23/66* (2013.01); *H01Q 1/2283* (2013.01); *H01Q 1/243* (2013.01); *H01Q 1/422* (2013.01); *H01Q 21/067* (2013.01); H01L 2223/6616 (2013.01); H01L 2223/6677 (2013.01)

(58) Field of Classification Search
CPC ............. H01L 23/66; H01L 2223/6616; H01L 2223/6677; H01Q 1/2283; H01Q 1/243; H01Q 1/422; H01Q 21/067
See application file for complete search history.

(56) References Cited

U.S. PATENT DOCUMENTS

| | | | |
|---|---|---|---|
| 2015/0070228 | A1 | 3/2015 | Gu et al. |
| 2017/0018513 | A1 | 1/2017 | Yoo et al. |
| 2017/0317418 | A1* | 11/2017 | Garcia ................. H01Q 9/0407 |
| 2018/0219272 | A1 | 8/2018 | Baheti et al. |

FOREIGN PATENT DOCUMENTS

| | | |
|---|---|---|
| CN | 104577308 A | 4/2015 |
| CN | 104901004 B | 7/2017 |
| CN | 105552541 B | 7/2018 |
| CN | 109687165 A | 4/2019 |
| CN | 208835263 U | 5/2019 |
| CN | 109888454 A * | 6/2019 |
| CN | 109962332 A | 7/2019 |

OTHER PUBLICATIONS

International Search Report and Written Opinion in International Appln. No. PCT/CN2019/130810, mailed on Sep. 30, 2020, 17 pages (with English translation).

* cited by examiner

*Primary Examiner* — Henry Luong (74) *Attorney, Agent, or Firm* — Fish & Richardson P.C.

(57) ABSTRACT

The disclosure provides a millimeter-wave antenna chip including a package substrate, at least one subunit, and a radio frequency chip. Each subunit includes an end-fire antenna disposed on an upper surface of the package substrate. The end-fire antenna is electrically connected to the radio frequency chip through a feed line. The radio frequency chip is located on a lower surface of the package substrate.

20 Claims, 9 Drawing Sheets

MILLIMETER-WAVE ANTENNA CHIP AND TERMINAL DEVICE

CROSS-REFERENCE TO RELATED APPLICATIONS

This application is a continuation of International Application No. PCT/CN2019/130810, filed on Dec. 31, 2019, the disclosure of which is hereby incorporated by reference in its entirety.

TECHNICAL FIELD

This application relates to radio frequency technologies, and in particular, to a millimeter-wave antenna chip and a terminal device.

BACKGROUND

As a transceiver component at an end of a communication system, an antenna plays an important role in the communication system. End-fire antennas feature high directionality. Traditionally, the end-fire antennas are most widely used in military fields, such as aircrafts and missiles. With the advent of the 5G communication era, millimeter waves are increasingly used in civil communication, and end-fire millimeter-wave antennas are more widely used.

In 5G application scenarios, a large quantity of terminal devices require millimeter-wave antennas. Different from traditional 3G and 4G terminal antennas, the millimeter-wave antennas will appear in a form of arrays to implement beam scanning and beamforming and meet a higher capacity requirement and a better coverage requirement. End-fire antenna arrays will provide horizontal beam coverage and implement omnidirectional coverage of an entire handheld terminal together with vertical beams of broadside arrays. However, an antenna is an extremely sensitive radiation component, especially in a millimeter-wave band. After being integrated into a mobile phone, the antenna is greatly affected by a peripheral component. Therefore, how to reduce impact of the peripheral component on the antenna becomes critical.

SUMMARY

This application provides a millimeter-wave antenna chip and a terminal device. An end-fire antenna is lifted to an upper surface of a package substrate of the chip by using stacked metal via holes of the package substrate. Therefore, impact of a metal frame of the terminal device on the end-fire antenna is minimized, and performance of the end-fire antenna is improved.

According to a first aspect, a millimeter-wave antenna chip is provided, including: a package substrate, at least one subunit, and a radio frequency chip. Each subunit includes an end-fire antenna disposed on an upper surface of the package substrate. The end-fire antenna is electrically connected to the radio frequency chip through a feed line. The radio frequency chip is located on a lower surface of the package substrate.

According to this embodiment of this application, the end-fire antenna is lifted to the upper surface of the package substrate by using the feed line located in the package substrate of the chip. A height of the end-fire antenna relative to a peripheral component may be increased by using a thickness of the package substrate. Therefore, impact of a metal frame of the terminal device on the end-fire antenna can be minimized, and performance of the end-fire antenna can be improved.

With reference to the first aspect, in some implementations of the first aspect, the subunit further includes a metalized fence. The feed line is located between the metalized fence and the end-fire antenna. The metalized fence includes a plurality of metal through holes extending from the upper surface of the package substrate to the lower surface, and a metal patch electrically connected to the plurality of metal through holes. A distance between any two of the plurality of metal through holes that are adjacent in a horizontal direction is less than one tenth of a wavelength corresponding to a resonance frequency of the end-fire antenna.

According to this embodiment of this application, because the end-fire antenna operates in a millimeter-wave band and has a high frequency, and the end-fire antenna is disposed on the upper surface of the package substrate and is far away from the radio frequency chip, when only the feed line is used to feed the end-fire antenna, the feed line is equivalent to a monopole antenna, radiates energy to the outside, and cannot provide an electrical signal for the end-fire antenna. However, in this application, the metalized fence may provide a reference ground for the feed line, and the metalized fence and the feed line form a structure similar to a microstrip transmission line, to avoid pattern distortion and a path loss caused by radiation of the feed line to space. For the microstrip transmission line, a characteristic impedance is related to a line width and a distance from the reference ground. Due to a process reason, a size of a metal via hole feed line must be within a specific range. Therefore, a proper characteristic impedance may be obtained by adjusting a spacing between the feed line and the metalized fence. Generally, a characteristic impedance of 50 ohms is required, and a range of the spacing between the feed line and the metalized fence may be 120 um to 160 um.

Optionally, a width of the metal patch may be 120 um to 160 um.

With reference to the first aspect, in some implementations of the first aspect, a distance between the metalized fence and the end-fire antenna is a quarter of the wavelength corresponding to the resonance frequency of the end-fire antenna.

According to this embodiment of this application, when the spacing between the metalized fence and the end-fire antenna is approximately a quarter of a wavelength, the metalized fence is equivalent to forming a metal reflective surface, and can reflect an electromagnetic wave radiated by the end-fire antenna in a direction of the metalized fence, so that the end-fire antenna can obtain a maximum gain in a target direction.

With reference to the first aspect, in some implementations of the first aspect, each subunit further includes a broadside antenna. The metalized fence is located between the broadside antenna and the end-fire antenna.

According to this embodiment of this application, the metalized fence may further provide good isolation between the broadside antenna and the end-fire antenna. The metalized fence forms a shielding wall between the broadside antenna and the end-fire antenna to suppress surface waves, so as to greatly reduce mutual interference between the two antennas. In this way, the two antennas can independently operate even when they are physically close to each other. To ensure shielding performance, the distance between any two adjacent metal through holes in the horizontal direction is generally less than one tenth of the wavelength corresponding to the resonance frequency of the end-fire antenna.

With reference to the first aspect, in some implementations of the first aspect, the metalized fence is located around the broadside antenna.

According to this embodiment of this application, when the chip includes a plurality of subunits, isolation of the broadside antenna in each subunit is better.

With reference to the first aspect, in some implementations of the first aspect, the feed line includes a first horizontal feed line, a second horizontal feed line, a first metal via hole feed line, and a second metal via hole feed line. One end of the first metal via hole feed line is electrically connected to the end-fire antenna at a first feeding point through the first horizontal feed line, and the other end of the first metal via hole feed line is electrically connected to the radio frequency chip. Two ends of the second metal via hole feed line are electrically connected to the end-fire antenna at a second feeding point through the second horizontal feed line, and the other end of the second metal via hole feed line is electrically connected to the radio frequency chip.

According to this embodiment of this application, a spacing between the first horizontal feed line and the second horizontal feed line may control a coupling degree between a first radiator and a second radiator of the broadside antenna, to adjust an imaginary part of an input impedance of the end-fire antenna. A smaller spacing indicates stronger coupling and a capacitive impedance, and a larger spacing indicates weaker coupling and an inductive impedance. For example, a value range of the spacing may be 60 um to 100 um. Widths of the first horizontal feed line and the second horizontal feed line may be used to adjust a real part of the input impedance of the end-fire antenna. A smaller width indicates a higher impedance, and a larger width indicates a lower impedance. For example, the input impedance is usually 50 ohms, and a value range of the width may be 60 um to 100 um.

With reference to the first aspect, in some implementations of the first aspect, the end-fire antenna is a dipole antenna.

According to this embodiment of this application, the end-fire antenna may be a folded dipole antenna or the dipole antenna.

With reference to the first aspect, in some implementations of the first aspect, a phase difference between an electrical signal at the first feeding point and an electrical signal at the second feeding point is 180°.

According to this embodiment of this application, the phase difference between the electrical signal at the first feeding point and the electrical signal at the second feeding point is 180°, so that no additional balun structure is required between two radiators of the end-fire antenna. In addition, a double gain, approximately 3 dB, can be obtained in original space.

With reference to the first aspect, in some implementations of the first aspect, the first metal via hole feed line and the second metal via hole feed line extend from the upper surface of the package substrate to the lower surface in an inverted V shape.

According to this embodiment of this application, the first metal via hole feed line and the second metal via hole feed line are designed by using this structure, so that mutual interference between the two metal via hole feed lines can be reduced, and performance of the end-fire antenna can be improved.

With reference to the first aspect, in some implementations of the first aspect, the end-fire antenna includes a parasitic element located on a side that is of the end-fire antenna and that is not adjacent to the feed line.

According to this embodiment of this application, a length of the radiator of the end-fire antenna is approximately a quarter of the wavelength corresponding to the resonance frequency of the end-fire antenna, and a low-frequency resonance point is generated in an operating band. A length of the parasitic element may be slightly less than a quarter of the wavelength corresponding to the resonance frequency of the end-fire antenna, and a high-frequency resonance point is generated in the operating band, to obtain a W-type return loss and broaden bandwidth of the end-fire antenna.

Optionally, a distance between a radiating element and the parasitic element of the end-fire antenna may be used to adjust a coupling degree between the radiating element and the parasitic element. A smaller distance indicates stronger coupling, and a larger distance indicates weaker coupling. A range of the distance between the radiating element and the parasitic element of the end-fire antenna may be 400 um to 600 um.

According to a second aspect, a terminal device is provided, including at least one millimeter-wave antenna chip. The chip includes a package substrate, at least one subunit, and a radio frequency chip. Each subunit includes an end-fire antenna disposed on an upper surface of the package substrate. The end-fire antenna is electrically connected to the radio frequency chip through a feed line. The radio frequency chip is located on a lower surface of the package substrate.

With reference to the second aspect, in some implementations of the second aspect, the subunit further includes a metalized fence. The feed line is located between the metalized fence and the end-fire antenna. The metalized fence includes a plurality of metal through holes extending from the upper surface of the package substrate to the lower surface, and a metal patch electrically connected to the plurality of metal through holes. A distance between any two of the plurality of metal through holes that are adjacent in a horizontal direction is less than one tenth of a wavelength corresponding to a resonance frequency of the end-fire antenna.

With reference to the second aspect, in some implementations of the second aspect, a distance between the metalized fence and the end-fire antenna is a quarter of the wavelength corresponding to the resonance frequency of the end-fire antenna.

With reference to the second aspect, in some implementations of the second aspect, each subunit further includes a broadside antenna. The metalized fence is located between the broadside antenna and the end-fire antenna.

With reference to the second aspect, in some implementations of the second aspect, the metalized fence is located around the broadside antenna.

With reference to the second aspect, in some implementations of the second aspect, the feed line includes a first horizontal feed line, a second horizontal feed line, a first metal via hole feed line, and a second metal via hole feed line. One end of the first metal via hole feed line is electrically connected to the end-fire antenna at a first feeding point through the first horizontal feed line, and the other end of the first metal via hole feed line is electrically connected to the radio frequency chip. Two ends of the second metal via hole feed line are electrically connected to the end-fire antenna at a second feeding point through the second horizontal feed line, and the other end of the second metal via hole feed line is electrically connected to the radio frequency chip.

With reference to the second aspect, in some implementations of the second aspect, the end-fire antenna is a dipole antenna.

With reference to the second aspect, in some implementations of the second aspect, a phase difference between an electrical signal at the first feeding point and an electrical signal at the second feeding point is 180°.

With reference to the second aspect, in some implementations of the second aspect, the first metal via hole feed line and the second metal via hole feed line extend from the upper surface of the package substrate to the lower surface in an inverted V shape.

With reference to the second aspect, in some implementations of the second aspect, the end-fire antenna includes a parasitic element located on a side that is of the end-fire antenna and that is not adjacent to the feed line.

With reference to the second aspect, in some implementations of the second aspect, the terminal device further includes a first printed circuit board and a second printed circuit board. The second printed circuit board is located between the first printed circuit board and the chip. The chip is electrically connected to the first printed circuit board.

DESCRIPTION OF EMBODIMENTS

A terminal device in embodiments of this application may be a terminal device that needs to perform communication, such as a mobile phone, a tablet computer, a notebook computer, a smart band, a smart watch, a smart helmet, smart glasses, or an unmanned aerial vehicle. The terminal device may alternatively be a cellular phone, a cordless phone, a session initiation protocol (SIP) phone, a wireless local loop (WLL) station, a personal digital assistant (PDA), a handheld device having a wireless communication function, a computing device, another processing device connected to a wireless modem, a vehicle-mounted device, a terminal device in a 5G network, a terminal device in a future evolved public land mobile network (public land Mobile network, PLMN), or the like. This is not limited in embodiments of this application.

Figure 1:
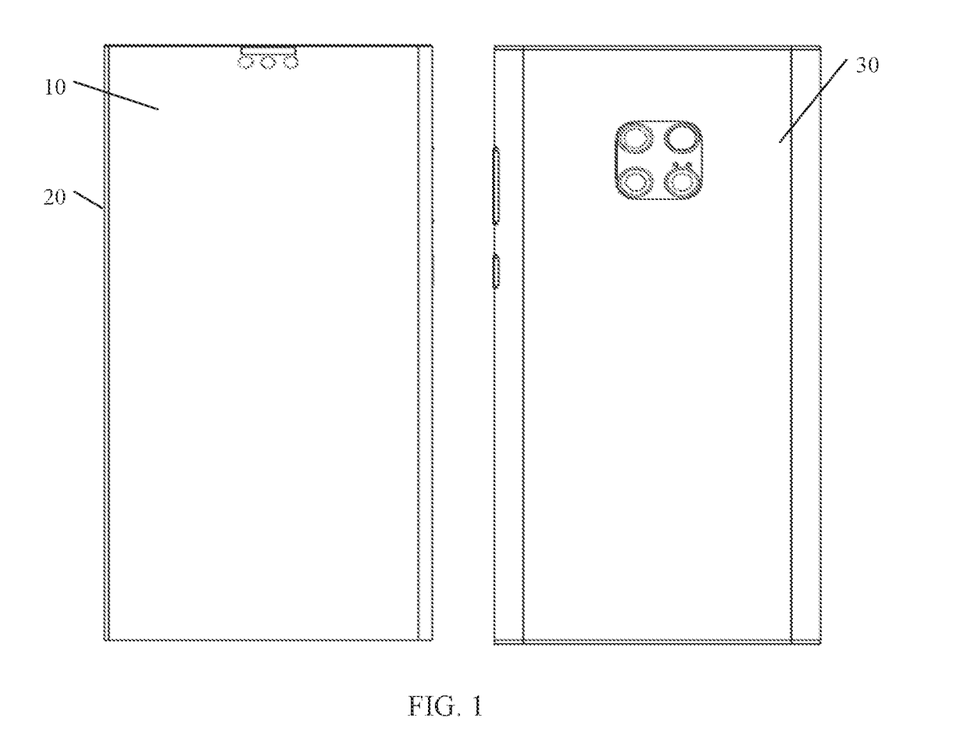
FIG. 1 is a schematic diagram of a terminal device applicable to an embodiment of this application.

FIG. 1 is a schematic diagram of a terminal device applicable to an embodiment of this application. Herein, an example in which the terminal device is the mobile phone is used for description.

As shown in FIG. 1, the terminal device has a shape similar to a cube, and may include a screen 10, a frame 20, and a rear cover 30. The screen 10 is mounted on the frame 20.

The terminal device further includes a printed circuit board (printed circuit board, PCB) disposed inside. Electronic components may be disposed on the PCB. The electronic components may include a capacitor, an inductor, a resistor, a processor, a camera, a flash, a microphone, a battery, and the like, but are not limited thereto.

The frame 20 may be a metal frame, for example, a metal such as copper, magnesium alloy, or stainless steel.

Figure 2:
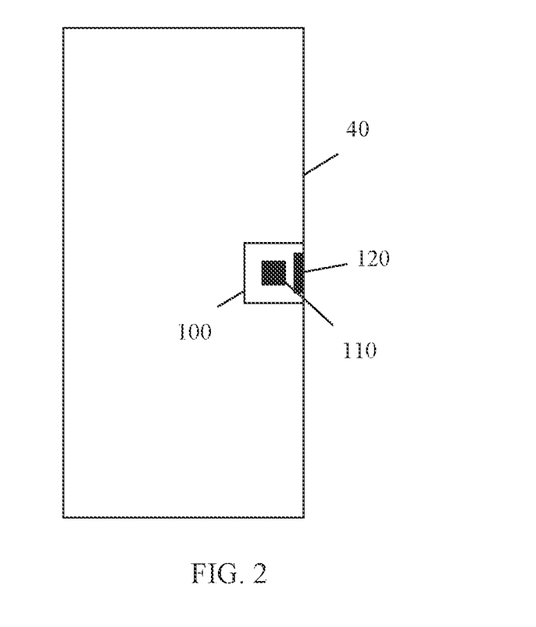
FIG. 2 is a schematic diagram of a layout of an antenna chip in a terminal device according to an embodiment of this application.

FIG. 2 is a schematic diagram of a layout of an antenna chip in a terminal device according to an embodiment of this application.

As shown in FIG. 2, the terminal device may further include a middle frame, a PCB 40, and a chip 100.

The middle frame and the frame may use an integrally formed structure. The PCB 40 may be mounted on the middle frame of the terminal device. The chip 100 may be fastened to the PCB 40 in a welding manner. A position of the chip 100 may be disposed based on an actual requirement. The chip 100 may further include a broadside antenna 110 and an end-fire antenna 120.

It should be understood that, an application processor (application processor, AP), a baseband module, and a radio frequency module may be further disposed on the PCB 40. The AP sends, to the baseband module, data that needs to be sent to the outside. The baseband module processes the data and then sends the processed data to the radio frequency module. The radio frequency module processes the data and then sends the processed data to the chip 100, and the chip 100 radiates the data to the outside.

Figure 3:
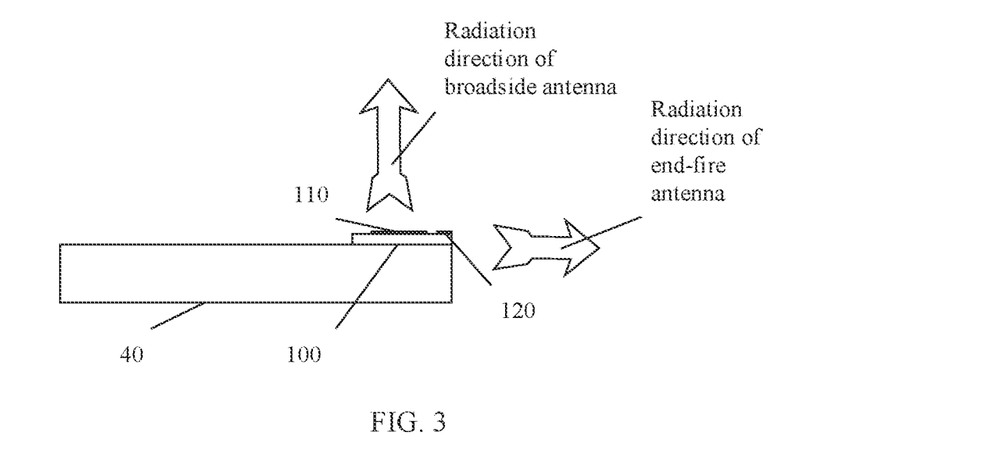
FIG. 3 is a schematic diagram of an antenna chip in a radiation direction according to an embodiment of this application.

FIG. 3 is a schematic diagram of an antenna chip in a radiation direction according to an embodiment of this application.

As shown in FIG. 3, a chip 100 is fastened to a PCB 40. A main radiation direction of a broadside antenna 110 of the chip 100 may be perpendicular to a plane on which the chip is located, to implement front coverage of a terminal device. A main radiation direction of an end-fire antenna 120 of the chip 100 may be parallel to the plane on which the chip is located, to implement side coverage of the terminal device.

It should be understood that a combination of the broadside antenna 110 and the end-fire antenna 120 on the chip 100 can implement full coverage and avoid a dead zone.

In a 5G application scenario, a millimeter wave can provide larger bandwidth and a higher data transmission rate. Therefore, a large quantity of terminal devices require millimeter-wave antennas. To implement a higher capacity and a better coverage requirement, the combination of the end-fire antenna and the broadside antenna is usually required. An end-fire antenna array provides horizontal beam coverage and implements omnidirectional coverage of an entire handheld terminal together with vertical beams of a broadside array. However, because a millimeter-wave antenna chip is usually disposed on the PCB of the terminal device, a millimeter-wave antenna is high in frequency, small in corresponding wavelength, and poor in capability of bypassing an obstacle. Therefore, a frame of the terminal device blocks radiation of the end-fire antenna in the millimeter-wave antenna chip, and performance of the end-fire antenna is reduced.

This application provides the millimeter-wave antenna chip. The end-fire antenna may be lifted to an upper surface of a package substrate of the chip by using stacked metal via holes of the package substrate, and a height of the end-fire antenna relative to a peripheral component may be increased by using a thickness of the package substrate. Therefore, impact of a metal frame of the terminal device on the end-fire antenna can be minimized, and performance of the end-fire antenna can be improved.

Figure 4:
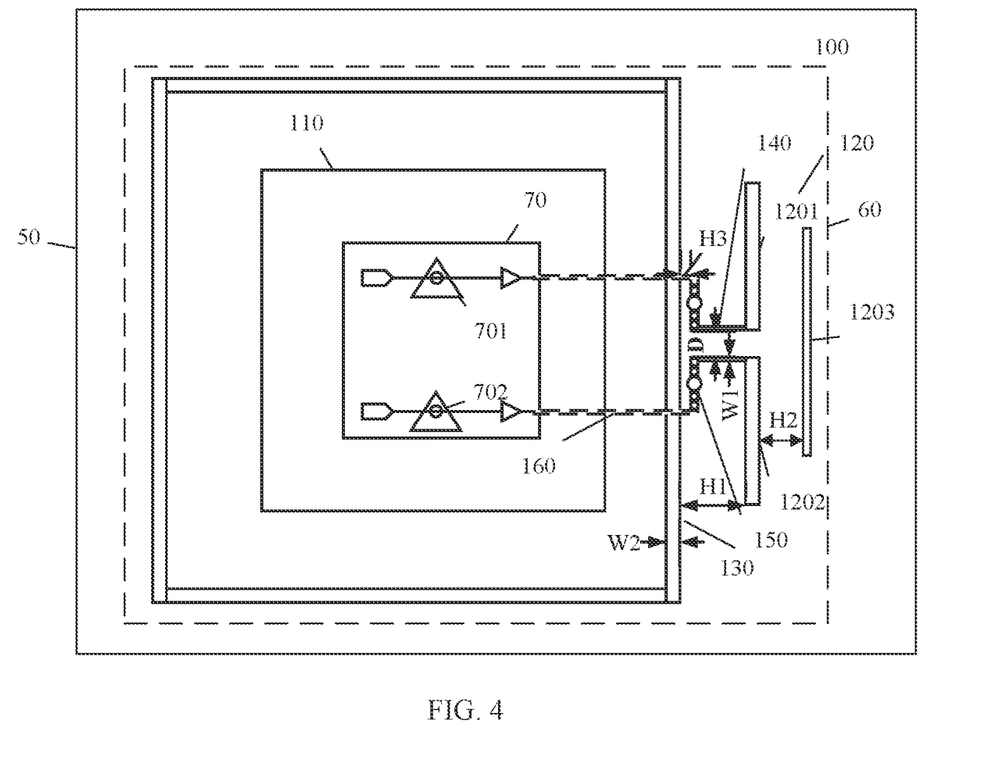
FIG. 4 is a top view of a millimeter-wave antenna chip according to an embodiment of this application.
Figure 5:
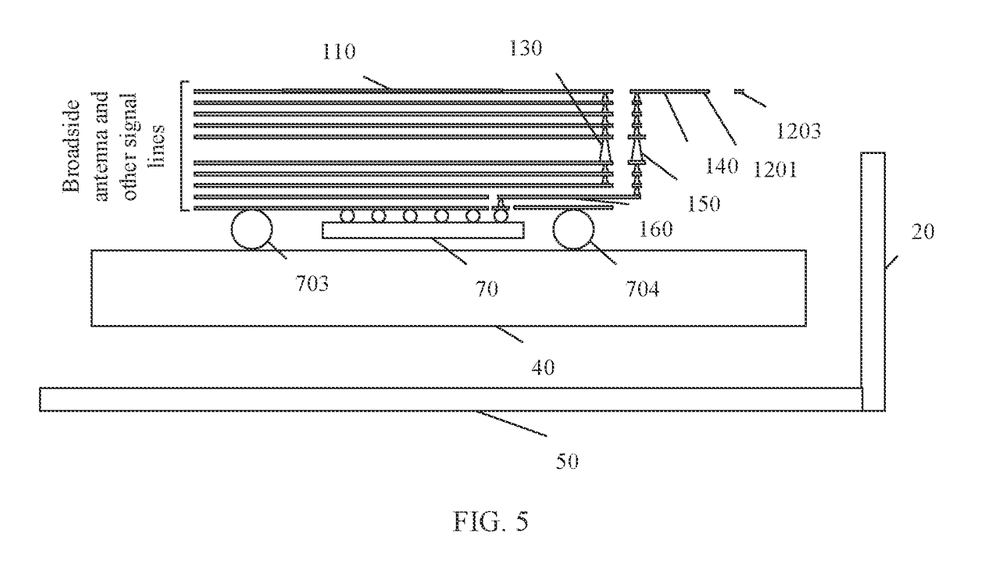
FIG. 5 is a schematic diagram of a cross section of a terminal device according to an embodiment of this application.
Figure 6:
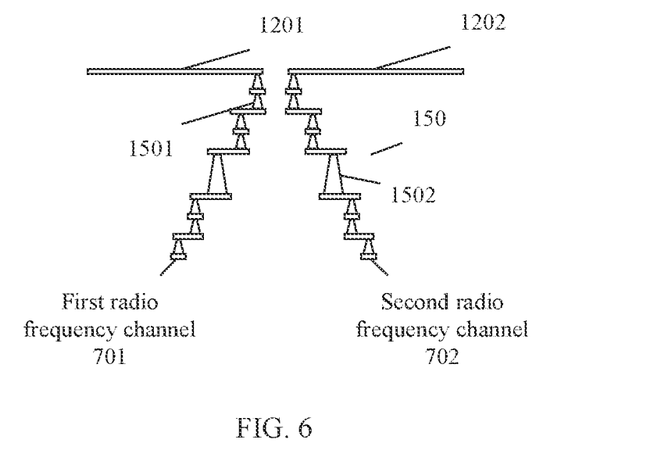
FIG. 6 is a schematic diagram of a structure of a metal via hole feed line according to an embodiment of this application.
Figure 7:
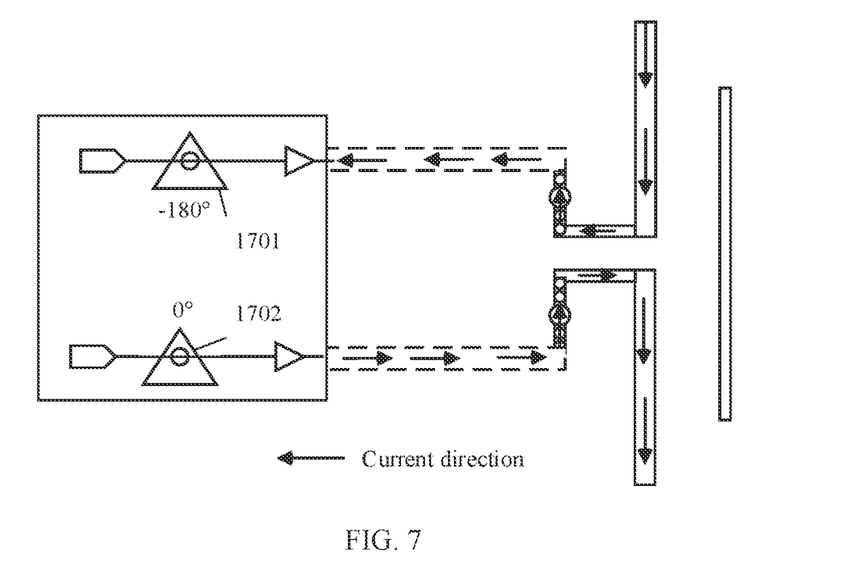
FIG. 7 is a schematic diagram of a radio frequency chip according to an embodiment of this application.
Figure 8:
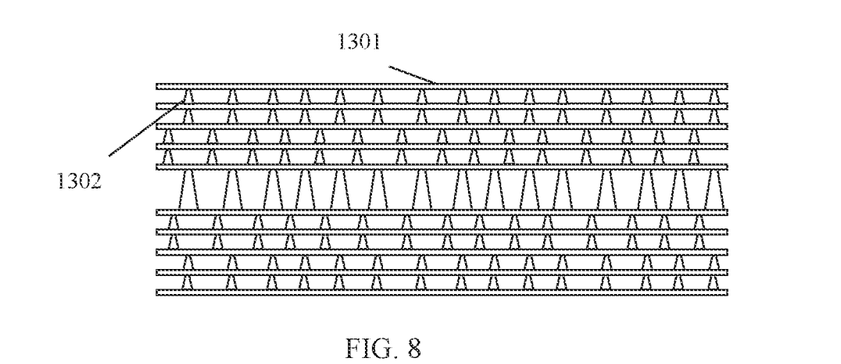
FIG. 8 is a schematic diagram of a structure of a metalized fence according to an embodiment of this application.
Figure 9:
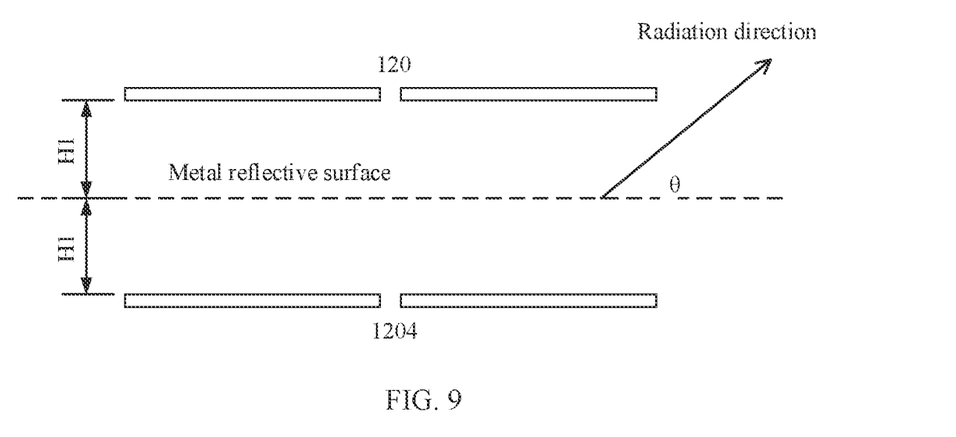
FIG. 9 is an equivalent schematic diagram of a metalized fence according to an embodiment of this application.

FIG. 4 to FIG. 9 are schematic diagrams of a chip according to an embodiment of this application. FIG. 4 is a top view of a millimeter-wave antenna chip according to an embodiment of this application. FIG. 5 is a schematic diagram of a cross section of a terminal device according to an embodiment of this application. FIG. 6 is a schematic diagram of a structure of a metal via hole feed line according to an embodiment of this application. FIG. 7 is a schematic diagram of a radio frequency chip according to an embodiment of this application. FIG. 8 is a schematic diagram of a structure of a metalized fence according to an embodiment of this application. FIG. 9 is an equivalent schematic diagram of the metalized fence according to an embodiment of this application.

As shown in FIG. 4, the chip 100 may include a package substrate 50, at least one subunit 60, and a radio frequency chip 70.

Each subunit 60 may include an end-fire antenna 120, which may be disposed on an upper surface of the package substrate 50. The end-fire antenna 120 is electrically connected to the radio frequency chip 70 through a feed line. The radio frequency chip 70 may be located on a lower surface of the package substrate 50.

It should be understood that, the end-fire antenna 120 is lifted to the upper surface of the package substrate 50. Therefore, impact of a frame of the terminal device on the end-fire antenna 120 is minimized. It may be considered that the upper surface of the package substrate is a surface that is not in contact with a PCB in the terminal device.

Optionally, the end-fire antenna 120 may be a folded dipole antenna or dipole antenna. In this embodiment of this application, a symmetric dipole is used as an end-fire antenna for description. However, a type of the end-fire antenna 120 is not limited in this application.

Optionally, the end-fire antenna 120 may include a first radiator 1201 and a second radiator 1202. Lengths of the first radiator 1201 and the second radiator 1202 are approximately one quarter of a wavelength corresponding to a resonance frequency of the end-fire antenna 120.

Optionally, the subunit 60 may further include a broadside antenna 110, which may be disposed on the upper surface of the package substrate 50.

Optionally, the feed line may include a horizontal feed line 140 and a metal via hole feed line 150.

The horizontal feed line 140 may be located on the upper surface of the package substrate 50. One end of the horizontal feed line 140 is electrically connected to the end-fire antenna 120, and the other end of the horizontal feed line 140 is electrically connected to the metal via hole feed line 150. As shown in FIG. 5, the metal via hole feed line 150 may extend from the upper surface of the package substrate to the lower surface and may be electrically connected to the radio frequency chip 70.

Optionally, the metal via hole feed line 150 may be electrically connected to the radio frequency chip 70 through a radio frequency line 160 inside the package substrate.

Optionally, the horizontal feed line 140 may include a first horizontal feed line and a second horizontal feed line, and may separately provide an electrical signal for the first radiator 1201 and the second radiator 1202 of the end-fire antenna. A spacing between the first horizontal feed line and the second horizontal feed line is D, and a coupling degree between the first radiator 1201 and the second radiator 1202 may be controlled by adjusting the spacing, to adjust an imaginary part of an input impedance of the end-fire antenna. A smaller D indicates stronger coupling and a capacitive impedance, and a larger D indicates weaker coupling and an inductive impedance. For example, a value range of D may be 60 um to 100 um. Widths of both the first horizontal feed line and the second horizontal feed line may be W1, and a real part of the input impedance of the end-fire antenna may be adjusted by adjusting a value of W1. A smaller W1 indicates a higher impedance, and a larger W1 indicates a lower impedance. For example, the input impedance is usually 50 ohms, and a value range of W1 may be 60 um to 100 um.

As shown in FIG. 6, the metal via hole feed line 150 may include a first metal via hole feed line 1501 and a second metal feed line 1502.

One end of the first metal via hole feed line 1501 may be electrically connected to the first radiator 1201 of the end-fire antenna at a first feeding point through the first horizontal feed line, and the other end of the first metal via hole feed line 1501 is electrically connected to a first radio frequency channel 701 of the radio frequency chip.

One end of the second metal via hole feed line 1502 may be electrically connected to the second radiator 1202 of the end-fire antenna at a second feeding point through the second horizontal feed line, and the other end of the second metal via hole feed line 1502 is electrically connected to a second radio frequency channel 702 of the radio frequency chip.

Optionally, the first metal via hole feed line 1501 and the second metal via hole feed line 1502 extend from the upper surface of the package substrate to the lower surface in an inverted V shape. The first metal via hole feed line 1501 and the second metal via hole feed line 1502 are designed by using this structure, so that mutual interference between the two metal via hole feed lines can be reduced, and performance of the end-fire antenna can be improved.

As shown in FIG. 7, each radio frequency channel in the radio frequency chip may include a phase shifter, so that a phase difference between an electrical signal output by the first radio frequency channel 1701 and an electrical signal output by the second radio frequency channel 1702 is 180°. In other words, a phase difference between an electrical signal at the first feeding point and an electrical signal at the second feeding point is 180°. In this way, no additional balun structure is required between two radiators of the end-fire antenna 120, and a double gain, approximately 3 dB, can be obtained in original space.

Optionally, the chip may be packaged by using a ball grid array package (ball grid array package, BGA) technology. When the chip is fastened to a PCB 40, the chip may be electrically connected to an external circuit through a first welding point 703 or a second welding point 704, and the radio frequency chip 70 obtains an electrical signal, as shown in FIG. 5.

Optionally, the subunit 60 may further include the metalized fence 130, and the feed line may be located between the metalized fence 130 and the end-fire antenna 120. As shown in FIG. 5, the metalized fence 130 may include a plurality of metal through holes extending from the upper surface of the package substrate to the lower surface.

Optionally, as shown in FIG. 8, the metalized fence may include a metal patch 1301 located on each layer of substrate in the package substrate and a plurality of metal through holes 1302 located on the package substrate. The metal patch 1301 is electrically connected to the plurality of metal through holes 1302.

Optionally, as shown in FIG. 5, a width W2 of the metal patch 1301 may be 120 um to 160 um.

Optionally, the metalized fence may be located around the broadside antenna 110, so that isolation of the broadside antenna is better when the chip includes a plurality of subunits.

It should be understood that, because the end-fire antenna operates in a millimeter-wave band and has a high frequency, and the end-fire antenna is disposed on the upper surface of the package substrate and is far away from the radio frequency chip, when only the metal via hole feed line is used, the metal via hole feed line is equivalent to a monopole antenna, radiates energy to the outside, and cannot provide an electrical signal for the end-fire antenna. However, in this application, the metalized fence may provide a reference ground for the metal via hole feed line, and the metalized fence and the metal via hole feed line form a structure similar to a microstrip transmission line, to avoid pattern distortion and a path loss caused by radiation of the metal via hole feed line to space. Therefore, the metalized fence is disposed, so that even if the end-fire antenna is placed on the upper surface of the packaged substrate, a large quantity of electrical signals are not radiated to the space through the feed line, and operating performance of the antenna is not affected. For the microstrip transmission line, a characteristic impedance is related to a line width and a distance from the reference ground. Due to a process reason, a size of the metal via hole feed line must be within a specific range. Therefore, a proper characteristic impedance may be obtained by adjusting a spacing H3 between the metal via hole feed line and the metalized fence. Generally, a characteristic impedance of 50 ohms is required. For example, a range of H3 may be 120 um to 160 um.

In addition, the metalized fence may further provide good isolation between the broadside antenna and the end-fire antenna. The metalized fence forms a shielding wall between the broadside antenna and the end-fire antenna to suppress surface waves, so as to greatly reduce mutual interference between the two antennas. In this way, the two antennas can independently operate even when they are physically close to each other. To ensure shielding performance, a distance between any two adjacent metal through holes in a horizontal direction is generally less than one tenth of the wavelength corresponding to the resonance frequency of the end-fire antenna.

In addition, a metal reflective surface is formed by the plurality of metal through holes and the metal patch in the metalized fence. According to a mirroring principle, the metal reflective surface enables the other side of the symmetric dipole to form an image antenna. As shown in FIG. 9, the symmetric dipole and the image antenna jointly form a two-element array, and an array factor of the two-element array is:

$$F_A(\theta) = \sin\left(\frac{2\pi}{\lambda} H \sin\theta\right),$$

where

θ is an angle between a radiation direction and a horizontal plane, H is a distance between the metal reflective surface and the dipole, and λ is a resonance wavelength of the antenna.

When it is required to obtain a maximum gain in a normal direction, that is, in a direction θ=90°, it may be learned that a formula H is λ/4. In this case, when a spacing H1 between the metalized fence and the end-fire antenna is approximately one quarter of the wavelength corresponding to the resonance frequency of the end-fire antenna, the end-fire antenna obtains the maximum gain.

Optionally, the end-fire antenna 120 may further include a parasitic element 1203 located on a side that is of the end-fire antenna and that is not adjacent to the feed line, as shown in FIG. 5. A distance between the parasitic element 1203 and each of the first radiator 1201 and the second radiator 1202 of the end-fire antenna is H2, and is used to adjust a coupling degree between a main radiating element and the parasitic element. A smaller distance indicates stronger coupling, and a larger distance indicates weaker coupling.

Optionally, a range of H2 may be 400 um to 600 um.

Figure 10:
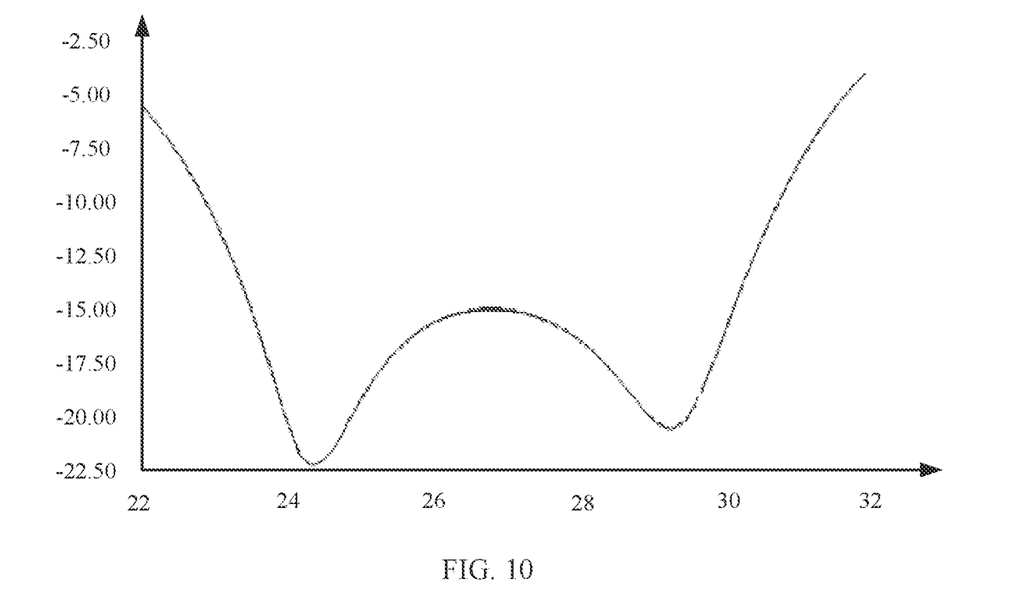
FIG. 10 is a schematic diagram of a return loss of an antenna shown in FIG. 5.

Optionally, lengths of the first radiator 1201 and the second radiator 1202 of the end-fire antenna are approximately a quarter of the wavelength corresponding to the resonance frequency of the end-fire antenna, to form a symmetric dipole antenna, and generate a low-frequency resonance point in an operating band. A length of the parasitic element 1203 may be slightly less than a quarter of the wavelength corresponding to the resonance frequency of the end-fire antenna, to generate a high-frequency resonance point in the operating band, to obtain a W-type return loss and greatly broaden bandwidth of the end-fire antenna, as shown in FIG. 10.

Figure 11:
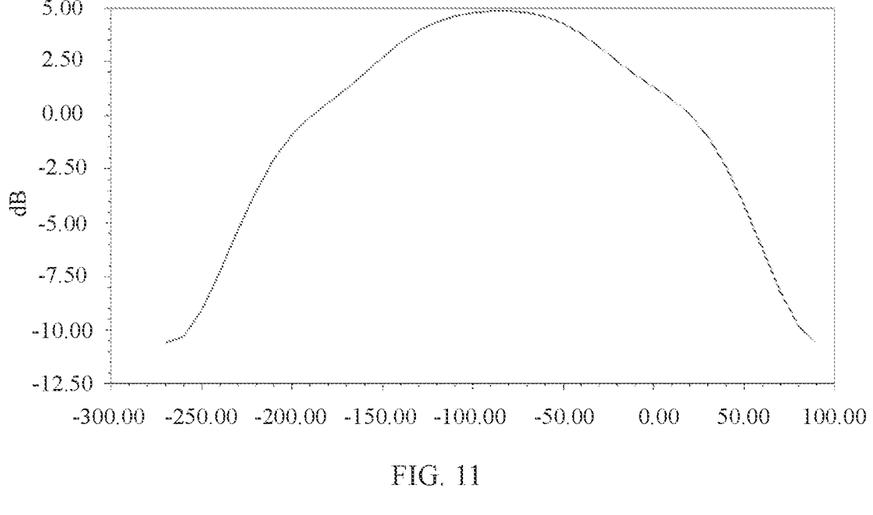
FIG. 11 is a schematic diagram of an H-plane gain curve of an antenna shown in FIG. 5.
Figure 12:
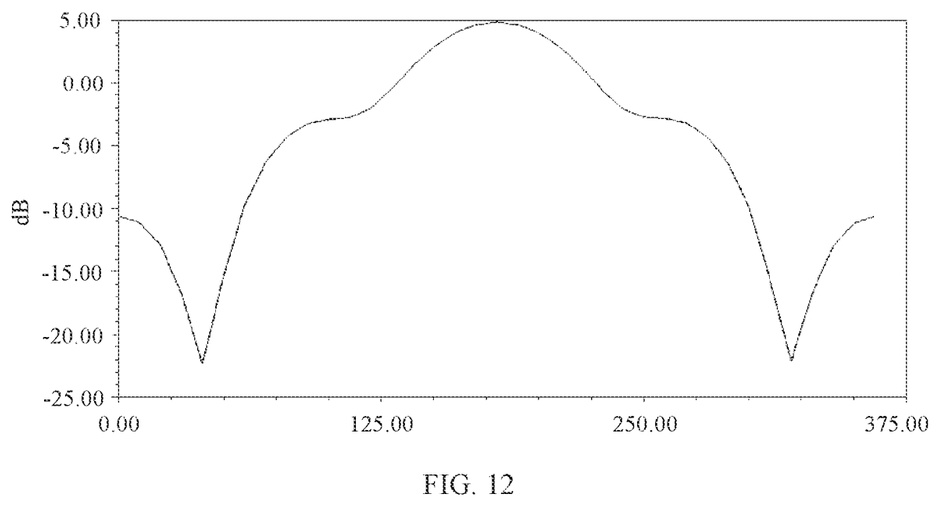
FIG. 12 is a schematic diagram of an E-plane gain curve of an antenna shown in FIG. 5.

FIG. 11 and FIG. 12 are schematic diagrams of corresponding gain curves of the chip in FIG. 5.

FIG. 11 is a schematic diagram of an H-plane gain curve of the chip, and FIG. 12 is a schematic diagram of an E-plane gain curve of the chip, both of which achieve a good effect.

Figure 13:
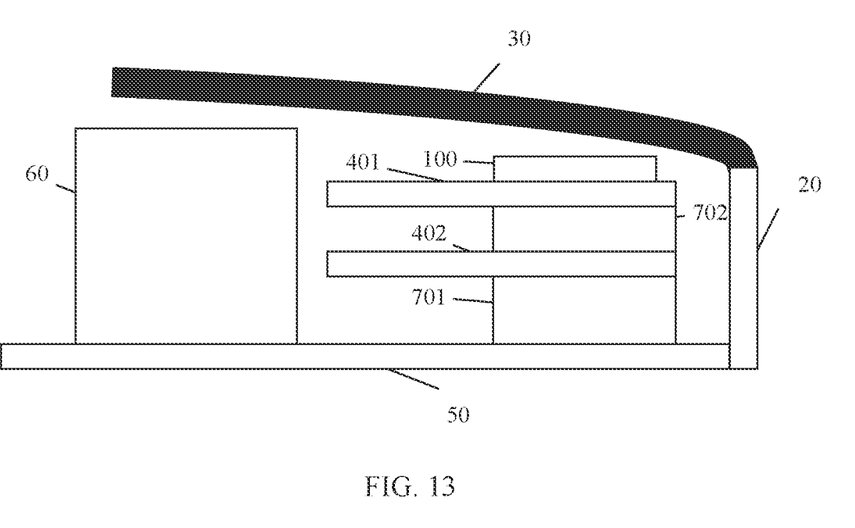
FIG. 13 is a schematic diagram of a structure of a terminal device according to an embodiment of this application.

FIG. 13 is a schematic diagram of a structure of a terminal device according to an embodiment of this application.

As shown in FIG. 13, a PCB may include a first PCB 401 and a second PCB 402.

The first PCB 401 may be mounted on a middle frame 50, and a chip 100 may be fastened to the first PCB 401. The chip 100 is electrically connected to the first PCB 401. The second PCB 402 may be further disposed between the first PCB 401 and the chip 100, to increase a height of the chip 100 and reduce interference from a frame 20.

Optionally, a first shielding cover 701 and a second shielding cover 702 may be further disposed on the first PCB 401. The first shielding cover 701 may be located between the first PCB 401 and the middle frame 50, and configured to accommodate a resistor, a capacitor, an inductor, or another electronic component. The second shielding cover

702 may be located between the first PCB 401 and the second PCB 402. The second shielding cover 702 may be configured to accommodate a radio frequency component related to the chip 100, for example, a resistor, a capacitor, an inductor, a duplexer, and a switch, so that a feeding line of the chip 100 can be reduced, and a loss can be reduced. In addition, the antenna 100 can be further lifted, to reduce interference caused by the frame 20 to the chip 100.

Figure 14:
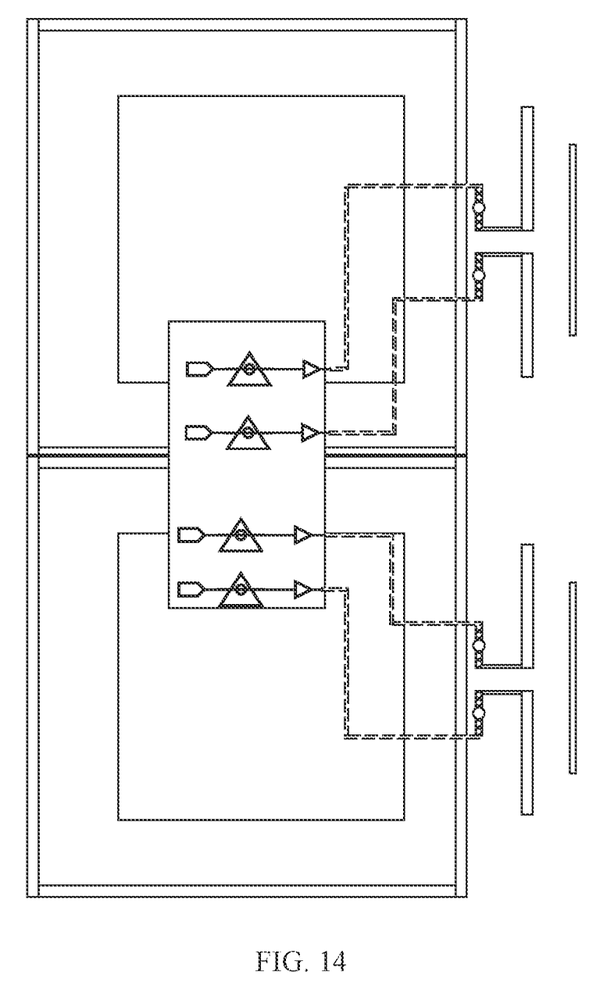
FIG. 14 is a schematic diagram of a structure of a millimeter-wave antenna chip according to an embodiment of this application.

FIG. 14 is a schematic diagram of a structure of a millimeter-wave antenna chip according to an embodiment of this application.

As shown in FIG. 14, a chip may include two subunits to implement a solution of a 1×2 antenna array. This already meets a requirement of a terminal device.

It should be understood that a quantity of subunits included in the chip is not limited in this application, and more subunits may be arranged in an array, for example, 1×3, 1×4, or 2×2.

Figure 15:
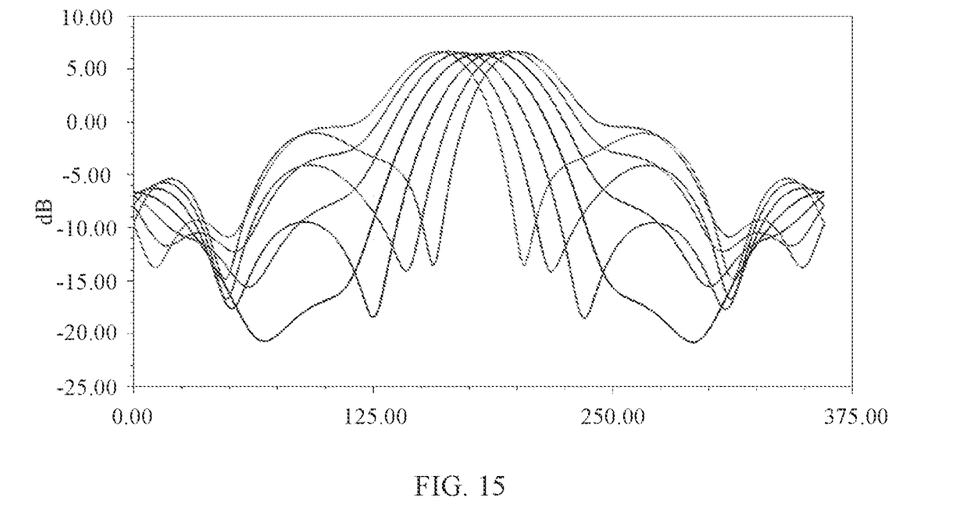
FIG. 15 is a schematic diagram of a gain curve of an antenna array shown in FIG. 14.

FIG. 15 is a schematic diagram of a gain curve of an antenna array shown in FIG. 14.

FIG. 15 is a gain curve of a millimeter-wave antenna of the 1×2 antenna array in FIG. 14 at different angles. It can be seen that good beam scanning may be performed on an E plane, to improve coverage of an antenna array system.

A person skilled in the art may use a different method to implement the described functions for each particular application, but it should not be considered that this implementation goes beyond the scope of this application.

It may be clearly understood by a person skilled in the art that, for ease and brevity of description, for a detailed working process of the foregoing systems, apparatuses, and units, refer to a corresponding process in the foregoing method embodiments. Details are not described herein again.

In the several embodiments provided in this application, it should be understood that the disclosed systems, apparatuses, and methods may be implemented in another manner. For example, the described apparatus embodiments are merely examples. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in an electrical form or another form.

The foregoing descriptions are merely specific implementations of this application, but the protection scope of this application is not limited thereto. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A millimeter-wave antenna chip, comprising:
a package substrate, at least one subunit, and a radio frequency chip, wherein:
each subunit comprises an end-fire antenna and a metalized fence, and the end-fire antenna is disposed on an upper surface of the package substrate;
the end-fire antenna is electrically connected to the radio frequency chip through a feed line, and the feed line is located between the metalized fence and the end-fire antenna; and
the radio frequency chip is located on a lower surface of the package substrate.

2. The millimeter-wave antenna chip according to claim 1, wherein:
the metalized fence comprises a plurality of metal through holes extending from the upper surface of the package substrate to the lower surface, and a metal patch electrically connected to the plurality of metal through holes; and
a distance between any two of the plurality of metal through holes that are adjacent in a horizontal direction is less than one tenth of a wavelength corresponding to a resonance frequency of the end-fire antenna.

3. The millimeter-wave antenna chip according to claim 2, wherein a distance between the metalized fence and the end-fire antenna is a quarter of the wavelength corresponding to the resonance frequency of the end-fire antenna.

4. The millimeter-wave antenna chip according to claim 2, wherein each subunit further comprises a broadside antenna, and the metalized fence is located between the broadside antenna and the end-fire antenna.

5. The millimeter-wave antenna chip according to claim 4, wherein the metalized fence is located around the broadside antenna.

6. The millimeter-wave antenna chip according to claim 1, wherein the feed line comprises:
a first horizontal feed line, a second horizontal feed line, a first metal via hole feed line, and a second metal via hole feed line, wherein:
one end of the first metal via hole feed line is electrically connected to the end-fire antenna at a first feeding point through the first horizontal feed line, and the other end of the first metal via hole feed line is electrically connected to the radio frequency chip; and
two ends of the second metal via hole feed line are electrically connected to the end-fire antenna at a second feeding point through the second horizontal feed line, and the other end of the second metal via hole feed line is electrically connected to the radio frequency chip.

7. The millimeter-wave antenna chip according to claim 6, wherein the end-fire antenna is a dipole antenna.

8. The millimeter-wave antenna chip according to claim 7, wherein a phase difference between an electrical signal at the first feeding point and an electrical signal at the second feeding point is 180°.

9. The millimeter-wave antenna chip according to claim 6, wherein the first metal via hole feed line and the second metal via hole feed line extend from the upper surface of the package substrate to the lower surface in an inverted V shape.

10. The millimeter-wave antenna chip according to claim 1, wherein the end-fire antenna comprises a parasitic element located on a side that is of the end-fire antenna and that is not adjacent to the feed line.

11. A terminal device, comprising at least one millimeter-wave antenna chip, wherein the at least one millimeter-wave antenna chip comprises a package substrate, at least one subunit, and a radio frequency chip, wherein:
each subunit comprises an end-fire antenna and a metalized fence, and the end-fire antenna is disposed on an upper surface of the package substrate;

the end-fire antenna is electrically connected to the radio frequency chip through a feed line, and the feed line is located between the metalized fence and the end-fire antenna; and the radio frequency chip is located on a lower surface of the package substrate.

12. The terminal device according to claim 11, wherein the metalized fence comprises a plurality of metal through holes extending from the upper surface of the package substrate to the lower surface, and a metal patch electrically connected to the plurality of metal through holes; and a distance between any two of the plurality of metal through holes that are adjacent in a horizontal direction is less than one tenth of a wavelength corresponding to a resonance frequency of the end-fire antenna.

13. The terminal device according to claim 12, wherein a distance between the metalized fence and the end-fire antenna is a quarter of the wavelength corresponding to the resonance frequency of the end-fire antenna.

14. The terminal device according to claim 12, wherein each subunit further comprises a broadside antenna, and the metalized fence is located between the broadside antenna and the end-fire antenna.

15. The terminal device according to claim 14, wherein the metalized fence is located around the broadside antenna.

16. The terminal device according to claim 11, wherein the feed line comprises:

a first horizontal feed line, a second horizontal feed line, a first metal via hole feed line, and a second metal via hole feed line, wherein:

one end of the first metal via hole feed line is electrically connected to the end-fire antenna at a first feeding point through the first horizontal feed line, and other end of the first metal via hole feed line is electrically connected to the radio frequency chip; and two ends of the second metal via hole feed line are electrically connected to the end-fire antenna at a second feeding point through the second horizontal feed line, and the other end of the second metal via hole feed line is electrically connected to the radio frequency chip.

17. The terminal device according to claim 16, wherein the end-fire antenna is a dipole antenna.

18. The terminal device according to claim 17, wherein a phase difference between an electrical signal at the first feeding point and an electrical signal at the second feeding point is 180°.

19. The terminal device according to claim 16, wherein the first metal via hole feed line and the second metal via hole feed line extend from the upper surface of the package substrate to the lower surface in an inverted V shape.

20. The terminal device according to claim 11, wherein the end-fire antenna comprises a parasitic element located on a side that is of the end-fire antenna and that is not adjacent to the feed line.

* * * * *